United States Patent [19]

Hatanaka

[11] Patent Number: 5,706,468
[45] Date of Patent: Jan. 6, 1998

[54] METHOD AND APPARATUS FOR MONITORING AND INTERFACING A DUAL PORT RANDOM ACCESS MEMORY IN A SYSTEM HAVING AT LEAST TWO INDEPENDENT CPUS

[75] Inventor: Yumiko Hatanaka, Yokohama, Japan

[73] Assignee: Fujitsu Limited, Kanagawa, Japan

[21] Appl. No.: 663,605

[22] Filed: Jun. 14, 1996

Related U.S. Application Data

[63] Continuation of Ser. No. 33,573, Mar. 18, 1993, abandoned.

[30] Foreign Application Priority Data

Mar. 19, 1992 [JP] Japan ................. 4-063377

[51] Int. Cl.$^6$ ................. G06F 12/00; G06F 13/00
[52] U.S. Cl. ................. 395/476; 364/DIG. 1; 364/DIG. 2; 364/239.7; 364/267.9; 365/230.05; 365/230.09; 395/476; 395/494; 395/185.08; 395/495
[58] Field of Search ................. 364/DIG. 1, DIG. 2, 364/239.7, 267.9; 395/402, 432, 458, 476, 477, 481, 495, 494, 185.03

[56] References Cited

U.S. PATENT DOCUMENTS

| 4,610,013 | 9/1986 | Long et al. ................. 371/9 |
| 4,698,753 | 10/1987 | Hubbins et al. ................. 395/425 |
| 4,999,768 | 3/1991 | Hirokawa ................. 395/425 |
| 5,155,729 | 10/1992 | Rysko et al. ................. 371/9.1 |
| 5,297,260 | 3/1994 | Kametari ................. 395/325 |
| 5,418,938 | 5/1995 | Hatanaka et al. ................. 395/575 |

FOREIGN PATENT DOCUMENTS 2263047  7/1993  United Kingdom .

OTHER PUBLICATIONS

"Dual–Port Static Rams Specialized Memories and Communication" Dave Pryce, EDN, Apr. 13, 1989; vol. 34, No. 8, pp. 83–89.

Primary Examiner—Tod R. Swann
Assistant Examiner—Tuan V. Thai
Attorney, Agent, or Firm—Helfgott & Karas, P.C.

[57] ABSTRACT

A method and system for interfacing a dual port RAM interface system are provided. The system is arranged in an optical transmission unit and used at supervisory/control sections thereof. When a DPRAM is unstable, two CPUs supervise it till settling stable so that a correct information regarding a self-system can be sent to a host supervisory unit. The DPRAM mounted with one of the CPUs is used as a data communication medium. The structure judges that the two CPUs are accessible to the DPRAM for normal writing/reading. If two judgements obtained are normal, data communications are started.

5 Claims, 7 Drawing Sheets

METHOD AND APPARATUS FOR MONITORING AND INTERFACING A DUAL PORT RANDOM ACCESS MEMORY IN A SYSTEM HAVING AT LEAST TWO INDEPENDENT CPUS

This is a continuation of application Ser. No. 08/033,573, filed Mar. 18, 1993, now abandoned.

BACKGROUND OF THE INVENTION

1) Field of the Invention

The present invention relates to a method and a system for interfacing a dual port random access memory (DPRAM), which is employed suitably in an optical transmission system and is used in supervisory/control fields where system failure monitoring, failure reporting to a host centralized supervisory system, and maintenance control are performed.

2) Description of the Related Art

Recently, transmitting large capacity data as well as realizing high dense Large Scale Integrated (LSI) assembly have increased the data amount handled in supervisory/control units. In order to deal with such problems, Central Processing Unit (CPU) distribution has been required where plural CPUs (or microcomputers) are deployed according to functions and an additional CPU is arranged to supervise and control the whole system.

In CPU distributing systems, a security mechanism is required to assure that a DPRAM acting as communication medium can perform normal reading/writing when the whole system is functionally realized while data communications are performed between CPUs.

FIG. 7 is a block diagram showing a conventional dual port RAM interface system. Referring to FIG. 7, the dual port RAM interface system includes a supervisory I/O 51, a CPU 1a arranged with a dual port RAM (hereinafter referred to DPRAM) 2a, a CPU 1b which is not arranged with a DPRAM, and a host supervisory unit 52. The CPUs 1a and 1b are constituted of as a physically and completely separated unit to transmit and receive data, respectively.

The DPRAM 2a has a data region 176 and a data transmission request flag region 53. The data transmission request flag region 53 is set for a data transmission request flag from the CPU 1b on the receiving side to the CPU 1a on the sending side.

In such a configuration, when transmitting and receiving data through the DPRAM 2a, the CPUs 1a and 1b shake hands in the data transmission request flag region 53 of the DPRAM 2a to each other. Namely, the CPU 1b on the receiving side writes a transmission request to the region 53 when a self-CPU starts up. After having verified that the region 53 wants a request, the CPU 1a on the sending side transmits data to the CPU 1b on the receiving side.

In the conventional DPRAM interface system, the CPU on the sending side is separated physically and completely from the CPU on the receiving side. Accordingly, when a CPU unit mounted with a DPRAM is incompletely inserted into a shelf or is in unstable, so-called half-inserted state, the CPU processing starts but the signal lines between the CPU on the sending side and the CPU on the receiving side through the DPRAM become unstable.

Such a state does not allow the CPUs to have normal writing and reading access to the DPRAM. Namely, the CPU on the receiving side cannot read in accordance with a value which is written by the CPU on the sending side. The value that the CPU on the sending side wrote previously may not coincide with one that the CPU reads from the same memory region of the DPRAM later.

When the CPU on the receiving side writes a transmission request to the CPU on the sending side, the CPU on the receiving side keeps waiting for data from the CPU on the sending side. In the reading/writing disagreement state, in actuality, since the CPU on the receiving side cannot read correctly the transmission request value written by the CPU on the sending side, it judges that a transmission request has not been read in. Hence data is never transmitted from the CPU on the receiving side to the CPU on the sending side.

Therefore there is a disadvantage in that a host supervisory system may not be able to recognize system information because the receiving side cannot give notice of failure information received from the sending side to the host supervisory system.

SUMMARY OF THE INVENTION

The present invention is made to overcome the above mentioned problems. Particularly, an object of the present invention is to provide a method for interfacing a DPRAM which is able to inform correct information on a self-system to a host supervisory system.

Another object of the present invention is to provide a DPRAM interface system where two CPUs supervise a DPRAM till the DPRAM can perform stable reading/writing operation when being unstable, and can inform correct information on a self-system to a host supervisory system.

The dual port RAM interfacing method according to the present invention which uses at least two CPUs being independent of to each other and a dual port RAM acting as data communications medium mounted with one of the CPUs for performing data communications between the CPUs, is characterized by the steps of judging that the CPUs are accessible to the dual port RAM to perform normal writing/reading operation; and then starting data communications if the results judged exhibit a normal state, respectively.

The CPU mounted with the dual port RAM is characterized by performing the steps of setting a sequence request flag to the dual port RAM when the dual port RAM has been cleared to zero after starting up; verifying that an external CPU has written test data in the dual port RAM; and verifying the data writing process by the external CPU when the test data has been rewritten; whereby it is judged that the results are normal state if both the CPUs are accessible to the dual port RAM to perform normal writing/reading.

The CPU mounted with the dual port RAM is characterized by performing the steps of rewriting a test data after the external CPU verifies a test data rewriting operation; and verifying again the test data rewriting operation using the external CPU; repeating the test data rewriting operation a desired number of times; whereby it is judged that the results are normal state if both the CPUs are accessible to the dual port RAM to perform normal writing/reading.

The CPU mounted with no dual port RAM is characterized by performing the steps of: referring the external CPU fail port periodically; rewriting a test data to the dual port RAM when the external CPU changes from abnormal state to normal state or a sequence request flag is set to the dual port RAM; verifying that the test data has been written to the dual port RAM by the external CPU; and verifying the test data rewriting operation using the external CPU when the test data is rewritten; whereby it is judged that the results are normal state if both the CPUs are accessible to the dual port RAM to perform normal writing/reading.

The CPU mounted with no dual port RAM is characterized by performing the steps: rewriting a test data after the external CPU verifies the test data rewriting operation; verifying the test data rewriting operation by the external CPU; and repeating the test data rewriting operation a desired number of times; whereby it is judged that the results are normal state if both the CPUs are accessible to the dual port RAM to perform normal writing/reading.

The self-CPU is characterized in that it is judged that results exhibit in normal state if both the CPUs are accessible to the dual port RAM to perform normal writing/reading when it is verified in a desired period of time that the set data has been rewritten by the external CPU after a sequence request flag or a test data was set.

The self-CPU also is characterized in that it is judged that the results exhibit an abnormal state if both the CPUs are accessible to the dual port RAM to perform normal writing/reading when it is not verified in a desired period of time that the set data has been rewritten by the external CPU after a sequence request flag or a test data was set.

A dual port RAM interface system characterized by at least two CPUs being independently to each other; and a dual port RAM mounted with one of the CPUs and used as a data communication medium to perform data communications between the CPUs; the CPUs each including: a watch dog timer supervisory means for monitoring a time-out of a watch dog timer; a self-CPU fail port which becomes on by recognizing the self-CPU in abnormal state when the watch dog timer supervisory means detects that the watch dog timer has become a time-out; an external CPU fail port which becomes on at event of an abnormal state of the external CPU; and a sequence checking means with a timer which monitors the state of the external CPU through the external CPU fail port and for performing an operational confirmation of the dual port RAM; the dual port RAM including: a sequence request flag portion for performing a sequence request flag writing operation by the CPU mounted with the dual port RAM; and a test data writing/reading portion for performing a test data writing/reading operation by both the CPUs; whereby whether both the CPUs are accessible to the dual port RAM to perform normal writing/reading is judged with the sequence checking means, by having an access to the external CPU fail port of the CPU, the sequence request flag portion of the dual port RAM and the test data writing/reading portion, and data communications is started when the results exhibit a normal state.

The sequence checking means is characterized by a sequence request supervisory means for monitoring whether the sequence request flag is set to the sequence request flag in the sequence request flag portion of the dual port RAM; a sequence request control means for setting the sequence request flag in the sequence request flag portion of the dual port RAM; a data presence/absence flag supervisory means for monitoring the test data writing/reading portion of the dual port RAM; and a data presence/absence flag control means for writing a test data in the test data writing/reading portion when the sequence request flag is set in the sequence request flag portion of the dual port RAM.

The sequence checking means in the CPU mounted with the dual port RAM includes at least the sequence request control means, and a data presence/absence flag supervisory means; and the sequence checking means in the CPU mounted with no dual port RAM includes at least the sequence request supervisory means, a data presence/absence flag supervisory means, and a data presence/absence flag control means.

The sequence checking means is characterized by means for judging that the results are normal if both the CPUs each are accessible to the dual port RAM to perform normal writing/reading after the test data rewriting operation is repeated by both the external CPU and the self-CPU a desired number of times.

The test data rewriting process is characterized by adding a desired number by the external CPU and the self-CPU, alternately.

In the DPRAM interfacing method according to the present invention, data communications is performed between at least two CPUs through a DPRAM as data communication medium. The CPUs are separated independently and the DPRAM is mounted with one of the CPUs. Namely, it is judged that both the CPUs are accessible to the DPRAM to perform normal writing/reading operation. If the results judged are normal, data communications are started later.

In this case the CPU mounted with the DPRAM performs the following process. First after the CPU starts up and then the DPRAM is cleared to zero, a sequence request flag is set to the sequence request flag portion of the DPRAM. Then the external CPU verifies that the test data has been written to the test data writing/reading portion of the DPRAM.

When the test data has been written or the external CPU verifies that the test data rewriting process, the CPU and the external CPU judge that the results are in normal state if an access to the DPRAM is possible to perform normal writing/reading operation.

The CPU mounted with the DPRAM also rewrites the test data after having verified the test data rewriting process of the external CPU. The external CPU verifies again the test data rewritten and rewrites it again. The CPU repeats the test data rewriting process a desired number of times together with the external CPU.

Then the CPU judges that the result on whether an access to the DPRAM to perform normal writing/reading process is normal, together with the external CPU.

The CPU mounted with no DPRAM performs the following process. Namely the external CPU is referred periodically. When the external CPU changes from abnormal state to normal state or a sequence request flag is set to the sequence request flag portion of the DPRAM, test data is written to the test data writing/reading portion of the DPRAM.

Then it is verified that the external CPU has written test data to the test data writing/reading portion of the DPRAM. By verifying that the test data has been rewritten or the external CPU has completed test data rewriting operation, it is decided together with the external CPU that the result judged on whether an access to the DPRAM for normal writing/reading is possible is normal.

After verifying that the external CPU has rewritten test data, the CPU mounted with no DPRAM rewrites the test data again. Furthermore the external CPU verifies the test data rewriting. The test data rewriting process is repeated together with the external CPU a desired number of times.

Then it is decided together with the external CPU that the results judged are normal if both the CPUs are accessible to the DPRAM for normal writing/reading.

After the self-CPU has set a sequence request flag or a test data, when the set data rewriting operation by the external CPU can be verified in a predetermined time, it is decided that the results judged on whether both the CPUs are accessible to the dual port RAM for normal writing/reading are normal state.

On the other hand, after the self-CPU has set the sequence request flag or test data, when the set data rewriting operation by the external CPU cannot be verified in a predetermined time, it is decided that the results judged are abnormal if both the CPUs are accessible to the dual port RAM for normal writing/reading.

In such a manner, each of the CPUs monitors whether the watch dog timer has become time-out using the watch dog timer supervisory means. When the time-out is detected, it is judged that the self-CPU is in abnormal state so that the self-CPU fail port becomes on.

If the external CPU is in abnormal state, the external CPU fail port becomes on. The sequence checking means with a timer monitors the condition of the external CPU by way of the external CPU fail port to perform the operation verifying process.

The sequence request flag portion in the DPRAM is subjected to a sequence request flag writing process by the CPU mounted with the DPRAM. The test data writing/reading portion is subjected to a test data writing/reading process by both the CPUs.

As a result, by gaining access to the sequence request flag portion and the test data writing/reading portion of the DPRAM via the external fail port of the CPU, the sequence checking means decides whether both the CPUs are accessible to the DPRAM for normal writing/reading. If the results are in normal state respectively, data communications is started later.

In a detail explanation on the sequence checking means, the sequence checking means monitors whether the sequence request supervisory means has set the sequence request flag to the sequence request flag of the sequence request flag portion of the dual port RAM.

When a sequence request flag is set to the sequence request flag portion of the dual port RAM, the data presence/absence flag control means writes a test data to the test data writing/reading portion.

Then the data presence/absence flag supervisory means monitors the test data writing/reading portion of the dual port RAM. If the test data is rewritten to a predetermined value, the data presence/absence flag control means repeats the test data rewriting process a desired number of times.

When the test data rewriting process is repeated by both the external CPU and the self-CPU a desired number of times, the decision means judges that the results are normal if both the CPUs are accessible to the dual port RAM for normal writing/reading.

When starting a sequence checking is requested, the sequence request supervisory means verifies that the sequence request flag has not been set to the sequence request flag of the sequence request flag portion of the dual port RAM.

If the sequence request flag is not set, the sequence request control means sets the sequence request flag to the sequence request flag portion in the dual port RAM.

Then the data presence/absence flag supervisory means monitors the test data writing/reading portion in the dual port RAM. If the test data has been written to a predetermined value, the data presence/absence flag control means rewrites the test data. Such a process is repeated a desired number of times.

When the test data rewriting process is repeated using the external CPU and the self-CPU a desired number of times, the decision means judges that the results are normal if both the CPUs are accessible to the dual port RAM for normal writing/reading. In order to perform the test data rewriting process using the external CPU and the self-CPU, a predetermined number may be added alternately.

In the external CPU mounted with the dual port RAM, the sequence checking means which is constituted of a sequence request control means, and a data presence/absence flag supervisory means carries out the following process:

First the sequence request control means sets the sequence request flag to the sequence request flag portion of the dual port RAM. Then, the data presence/absence flag supervisory means monitors the test data writing/reading region of the dual port RAM.

In the CPU mounted with no dual port RAM, the sequence checking means which is constituted of a sequence request supervisory means, a data presence/absence flag monitoring means, and a data presence/absence flag control means carries out the following process:

Namely the sequence request supervisory means monitors that the sequence request flag is set the sequence request flag of the sequence request flag portion in the dual port RAM.

When the sequence request flag is set to the sequence request flag portion of the dual port RAM, the data presence/absence control means write a test data to the test data writing/reading portion. Then the data presence/absence supervisory means monitors the test data writing/reading portion in the dual port RAM.

As describes above, the DPRAM interface system according to the present invention has an advantage in that correct information can be informed from the self-CPU to a host supervisory system. Moreover there is an advantage that when the DPRAM is in unstable, both the CPUs can monitor it till settling for stable writing/reading so that correct information can be informed to a host supervisory system from the self-CPU.

DESCRIPTION OF THE PREFERRED EMBODIMENTS

Referring to the attached drawings, an explanation will be made in detail as for a preferred embodiment of the dual port RAM interface system according to the present invention.

Figure 1:
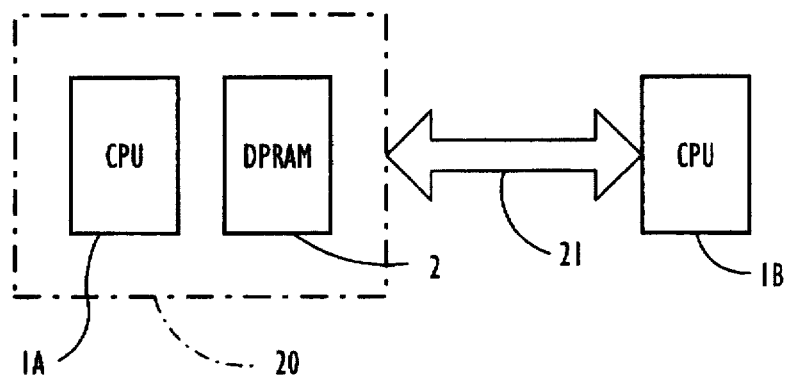
FIG. 1 is a block diagram showing an embodiment of the dual port RAM interface system according to the present invention.

FIG. 1 is a block diagram showing an embodiment of the dual port RAM interface system according to the present invention. In FIG. 1, numeral 20 represents an CPU unit mounting a DPRAM. The CPU unit 20 mounting a DPRAM is connected to a CPU 1B by way of a bus line 21. The unit 20 comprises a CPU 1A and a DPRAM 2.

Figure 3:
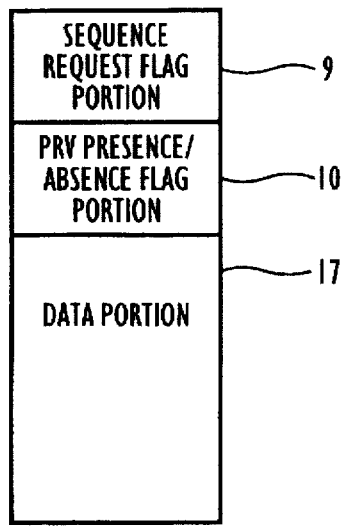
FIG. 3 is a block diagram showing memory area in a DPRAM for an embodiment of the dual port RAM interface system according to the present invention.

The DPRAM 2, as shown in FIG. 3, includes a sequence request flag portion 9, a provision presence/absence flag portion (PRV presence/absence flag portion) 10 acting as a test data writing/reading portion, and a data portion 17 acting as a memory area. The sequence request flag portion 9 is a memory area where a sequence request flag writing operation is performed by the CPU 1A mounted together with the DPRAM 2.

After the DPRAM has been cleared, the sequence request flag portion 9 enters an on state to produce a request for sequence check to the opposite CPU. The flag portion 9 is cleared after a sequence check completion or sequence check failure.

At a sequence checking, the PRV presence/absence flag portion 10 is a memory area where a test data writing/ reading process is performed with both the CPU at the sending side and the CPU at the receiving side. The PRV presence/absence flag portion 10 is an area where, at normal time, the CPU on the receiving side writes information on a presence or absence of data, or an area for storing provision data item numbers showing a presence or absence of data of the data items, in a database (refer to FIG. 2) 12 in the self-CPU.

The data region 17 is an area for performing data writing/ reading operation at normal communications, or a memory area where the CPU on the sending side writes transmission data while the CPU on the receiving side reads the data.

When data communications are performed between at least the CPUs 1A and 1B, which are arranged independently, the DPRAM 2, which is mounted together with one of the CPUs, is shared by the CPUs as a data communication medium.

The CPUs 1A and 1B verify whether they are accessible to the DPRAM for normal reading/writing. If two results, which are judged exhibit normal state, data communications is ready to start later.

Figure 2:
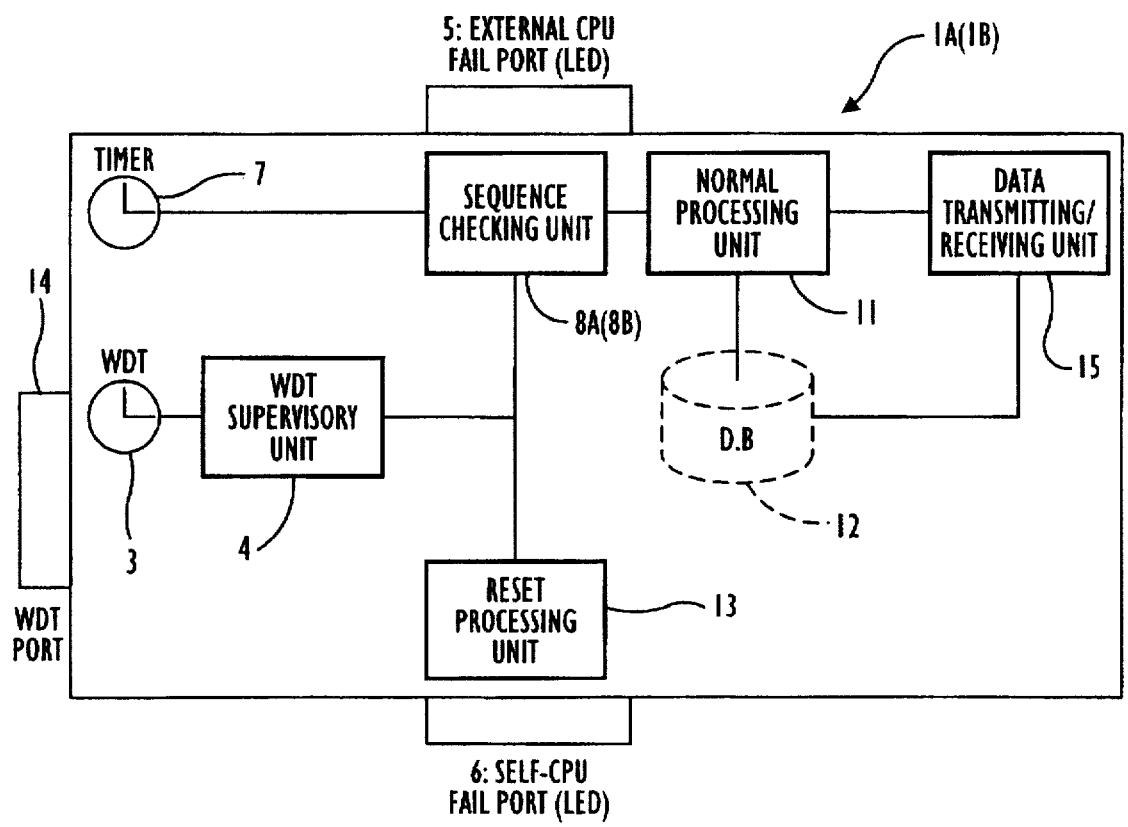
FIG. 2 is a block diagram showing in detail a CPU used for an embodiment of the dual port RAM interface system according to the present invention.

As shown in FIG. 2, the CPUs 1A and 1B each have a watch dog timer supervisory unit 4 including a watch dog timer (WDT) 3, an external CPU fail port 5, a self-CPU fail port 6, a sequence checking unit 8 with a timer 7, a data transmitter/receiver unit 15, a normal processor 11, a database 12, a reset processing unit 13, and a watch dog timer port 14.

The watch dog timer 3 measures a time-out and outputs it to the watch dog timer supervisory unit 4. The watch dog timer supervisory unit 4 supervises the time-out of the watch dog timer 3, and performs periodically a write access to the watch dog timer port 14.

The external CPU fail port 5 is an I/O port which is normally off. The external CPU fail port 5 also is on in event of an abnormal state of the external CPU and off in event of the state restored from the abnormal state.

The self CPU fail port 6 is an I/O port for watching from the opposite side. The I/O port becomes on by recognizing that the self CPU 1 is in abnormal state if the watch dog timer supervisory unit 4 detects the time-out of the watch dog timer 3.

The normal processor 11 performs data transmission and reception process after the sequence checking has been completed normally. The database 12 holds data to be processed.

When a periodical access ceases to the watch dog timer 3 in the watch dog timer supervisory unit 4, the reset processing unit 13 is triggered and allows the CPU to function from the initial stage. The watch dog timer port 14 is an I/O port which is subjected to a write access during a limited period of time that the watch dog timer supervisory unit 4 is watching. The data transmission and receiving unit 15 gains a read/write access to the DPRAM 2.

The timer 7 which is added to the sequence checking units 8A and 8B inform time. The sequence checking units 8A and 8B supervise the external CPU 1 by way of the external CPU fail port 5 and verifies the operation or stability of the DPRAM 2.

Figure 4:
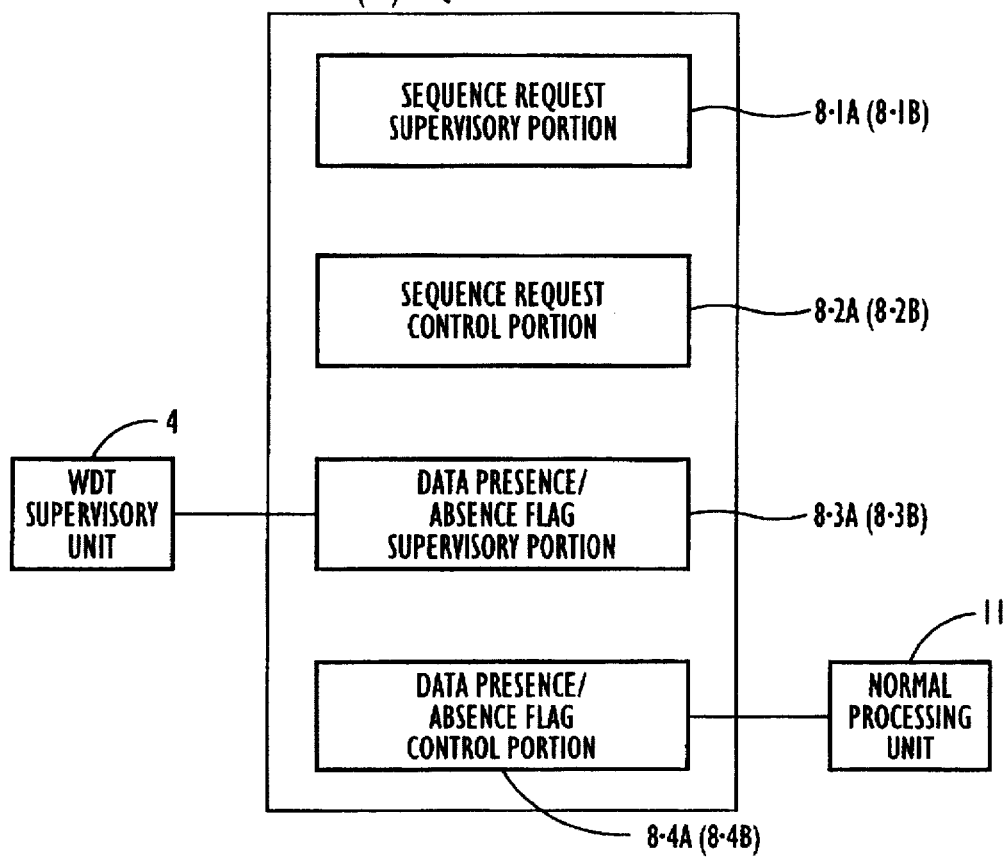
FIG. 4 is a block diagram showing in detail the sequence checking portion of a CPU in an embodiment of the dual port RAM interface system according to the present invention.

The sequence checking units 8A and 8B, as shown in FIG. 4, is constituted of sequence request supervisory units 8.1A and 8.1B, sequence request controllers 8.2A and 8.2B, data presence/absence flag supervisory units 8.3A and 8.3B, and data presence/absence flag controllers 8.4A and 8.4B. The data presence/absence flag supervisory units 8.3A and 8.3B are connected to the watch dog timer supervisory unit 4. The data presence/absence 8.4A and 8.4B are connected to the normal processing unit 11.

The sequence request supervisory units 8.1A and 8.1B verify whether the external CPU (mounted together with the DPRAM) has set "with a sequence checking request" in the sequence request flag of the sequence request flag unit 9 in the DPRAM 2.

The sequence request controllers 8.2A and 8.2B set "with a sequence request" to the sequence request flag portion 9 after the self CPU mounted together with the DPRAM has cleared all areas of the DPRAM 2 to zero.

The data presence/absence flag supervisory units 8.3A and 8.3B supervise periodically the PRV presence/absence flag portion 10 of the DPRAM 2. The data presence/absence flag supervisory units 8.3A and 8.3B verifie during a limited time whether the external CPU has incremented the read data (test data) by 1 in comparison with the initial value which was set in the sequence request flag portion 9 by using the data presence/absence flag controllers 8.4A and 8.4B in the DPRAM 2. Thus a sequence checking process has performed successfully once. If data referred is not incremented by 1 through the data adding step during the limited time, this process is processed again from the initial value setting step.

When the data presence/absence flag supervisory units 8.3A and 8.3B verify a desired number of times that the data read has incremented by 1, the PVD presence/absence flag portion 10 is cleared. When the external CPU verifies that the PRV presence/absence flag portion 10 has been cleared, the "no sequence request" is written to the sequence request flag.

When the self CPU arranged with no DPRAM changes from abnormal state to normal state or the external CPU sets "with a sequence request" to the sequence request flag portion 9 of the DPRAM 2, the data presence/absence flag controllers 8.4A and 8.4B set a sequence initial data to the PRV presence absence flag (data presence/absence flag) in the provision presence/absence flag portion 10.

The above configuration verifies whether both the CPUs 1A and 1B can have access to the DPRAM 2 to perform normal writing/reading. Namely, the sequence check portion 8A of the CPU 1A has access to the sequence request flag portion 9 and the PRV presence/absence flag portion 10 of the DPRAM 2 through the external CPU. The sequence check portion 8B of the CPU 1B has access to the sequence request flag portion 9 and the PRV presence/absence flag portion 10 of the DPRAM 2 through the external CPU.

Thus the sequence checking portions 8A and 8B verify whether an access for the normal writing/reading is available. If two results obtained exhibit normal states, data communications is ready to be started later.

The basic operation of a sequence checking process has been generally explained above. A detail explanation will be made below. First, an explanation will be directed to the CPU 1A mounted together with the DPRAM 2. In the CPU 1A mounted together with the DPRAM 2, when the self CPU 1A starts up, all areas of the DPRAM 2 are cleared to zero.

In order to start a sequence checking operation, the CPU 1A mounted with the DPRAM 2 writes "with a sequence request" in the sequence request flag portion 9 of the DPRAM 2 according to the sequence request controller 8.2A of the sequence checking portion 8A.

At the same time, the CPU 1A mounting the DPRAM 2 monitors periodically the PRV presence/absence flag portion 10 by the data presence/absence flag supervisory unit 8.3A of the sequence checking portion 8A. As a result, the data presence/absence flag supervisory unit 8.3A verifies that the test data PRV presence/absence flag has been rewritten to a sequence initial value. It is recognized that the external CPU 1B has performed the test data rewriting process since the DPRAM 2 was cleared to zero previously.

If the test data rewriting is verified to be successful, it is considered that the first sequence is successful. In that case, the data presence/absence flag supervisory unit 8.3A performs a writing operation by incrementing the read data by 1.

In event of failure, the sequence request controller 8.2A repeats the test rewriting from the sequence initial setting step for a limited period of time. If the rewriting is verified during the limited period of time, an increment operation is performed as described above.

When a failure occurs on the way of the sequence checking and prevents verifying a rewriting operation during a limited time, the watch dog timer supervisory unit 4 ceases an access to the watch dog timer by recognizing that the sequence checking has been failed completely.

At a result, the timer 7 becomes time-out. Then the self CPU fail port 6A which shows FAIL of the self CPU 1A becomes on since an abnormal state occurring in the self CPU 1A ceases the operation of the CPUs 1A and 1B. The reset processing units in the CPUs 1A and 1B are triggered and the CPU on the receiving side restarts from the reset state.

As described above, a basic operation has been made as for a sequence check of the CPU 1A mounted together with the DPRAM 2. Next a detail explanation will be made as for a basic operation of the CPU 1B mounted with no DPRAM 2. The CPU 1B mounted with no DPRAM 2 refers periodically to the external CPU fail port 5B using the data presence/absence flag supervisory unit 8.3B.

Thus a sequence checking is started if the external CPU 1A changes from abnormal state to normal state or if the sequence checking unit 8A of the external CPU 1A sets a sequence request flag having the content of "with a sequence check request" to the sequence request flag portion 9 of the DPRAM 2.

In a sequence checking step, in the CPU 1B mounted with no DPRAM, the data presence/absence flag controller 8.4B in the sequence checking unit 8B sets a sequence initial data (test data) to the PRV presence/absence flag portion 10 of the DPRAM 2.

The data presence/absence flag supervisory unit 8.3B reads periodically the PRV presence/absence flag portion after waiting for a rewriting time at the opposite side according to the timer 7B.

When the above step verifies that a sequence check start data value (sequence initial value) has been incremented by 1, it is regarded that the first sequence checking is successful. Then the read-out value is incremented further by 1.

If the reference data is not incremented by 1, it is regarded that the sequence checking was failed on the way. Hence the procedure is retried from the stage where the data presence/absence flag controller 8.4B sets the sequence initial data to the PRV presence/absence flag portion 10 by the limited period of time.

If the first sequence checking is successful within the limited time, the data presence/absence flag controller 8.4B increments the data read by 1 in the PRV presence/absence flag portion 10.

If the sequence checking comes to failure on the way and the rewriting is not rewritten for a limited time, it is regarded that the sequence checking has failed completely. Thus the watch dog timer supervisory unit 4B ceases an access to the watch dog timer.

As a result, the timer 7 shows time-out. Thus the self CPU fail port 6B which shows the fail state of the self CPU 1B becomes on to cease the CPUs 1A and 1B since it is regarded that an abnormal state has occurred in the self CPU 1B. The reset processing portions in the CPUs 1A and 1B are triggered and the CPU on the receiving side is restarted from the reset state.

As described above, if the first sequence checking is successful, both the CPU 1A mounted with the DPRAM and the CPU 1B mounted without no DPRAM try again the sequence checking from the initial state. If the sequence checking to the CPUs 1A and 1B is successful continuously three times, the sequence checking is completed.

Namely, after a test data rewriting process is verified by the external CPU, the test data is rewritten again. The test data writing is verified with the external CPU. The test data rewriting process is repeated three times with the external CPU. If the verification is succeeded continuously three times, it is decided that the sequence checking has been successful.

The success verifies that both the CPU 1A and the CPU 1B are accessible to the DPRAM 2 to perform normal writing/reading, the results are in normal state.

If the self CPU and the external CPU are verified to be normal, the CPU 1A mounted together with the DPRAM sets "without a sequence request" to the sequence request flag portion 9 when the sequence checking completion has been verified.

The CPU 1B mounted without the DPRAM rewrites "with no data" to the PRV presence/absence flag portion 10 when the sequence checking completion has been verified. When the CPU 1A mounted with the DPRAM verifies that there are no data in the PRV presence/absence flag portion 10, normal communications processing is started. According to the above procedure, the CPUs 1A and 1B perform the sequence checking prior to starting data communications.

An explanation has been made above as for the basic operation in the sequence checking. According to the conditions of the CPU, various processes may be applicable for the basic operation. The sequence checking is performed by a proper process so as to match circumstances.

Figure 5A:
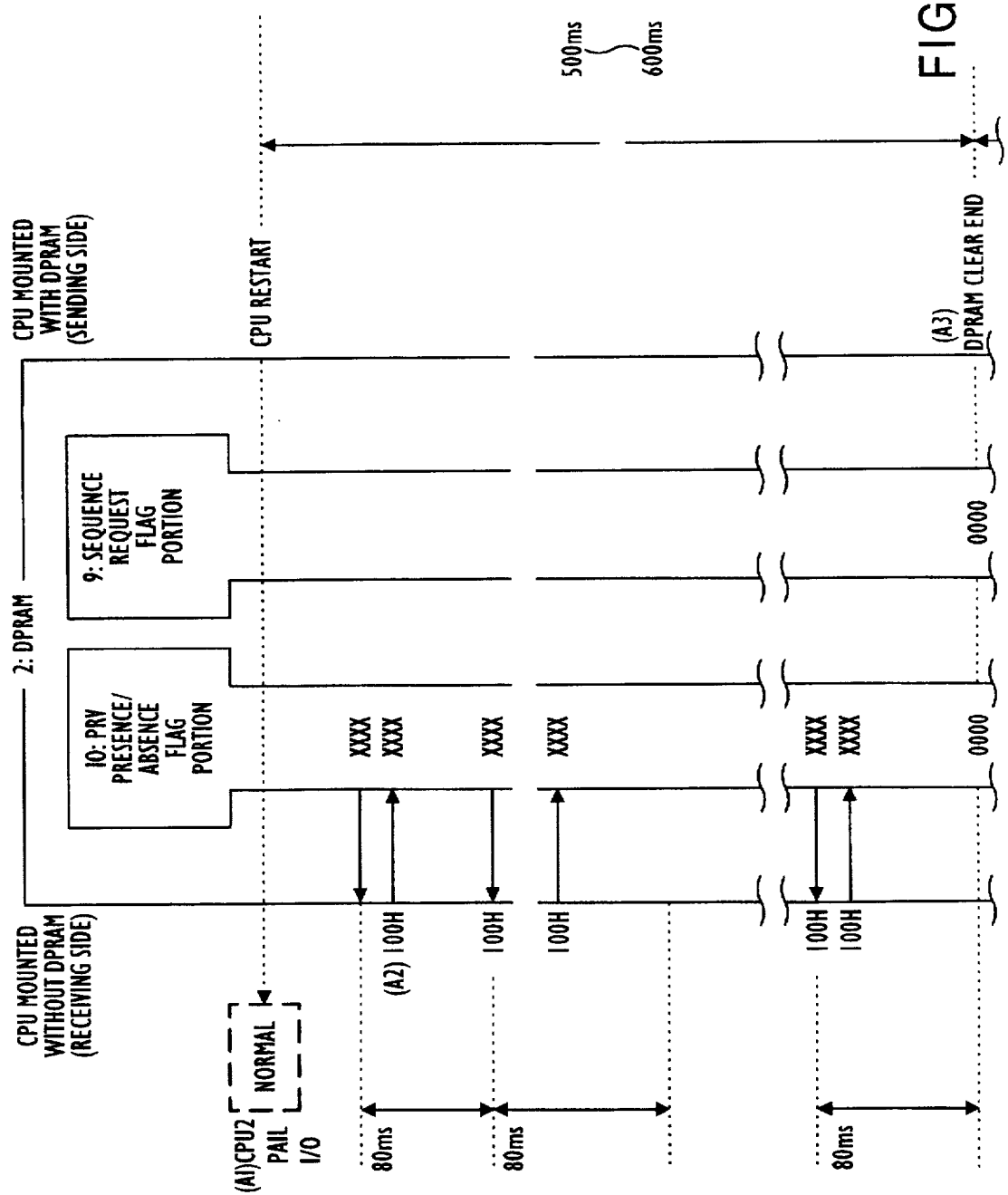
FIG. 5 is a sequence diagram showing a function of an embodiment of the dual port RAM interface system.
Figure 5B:
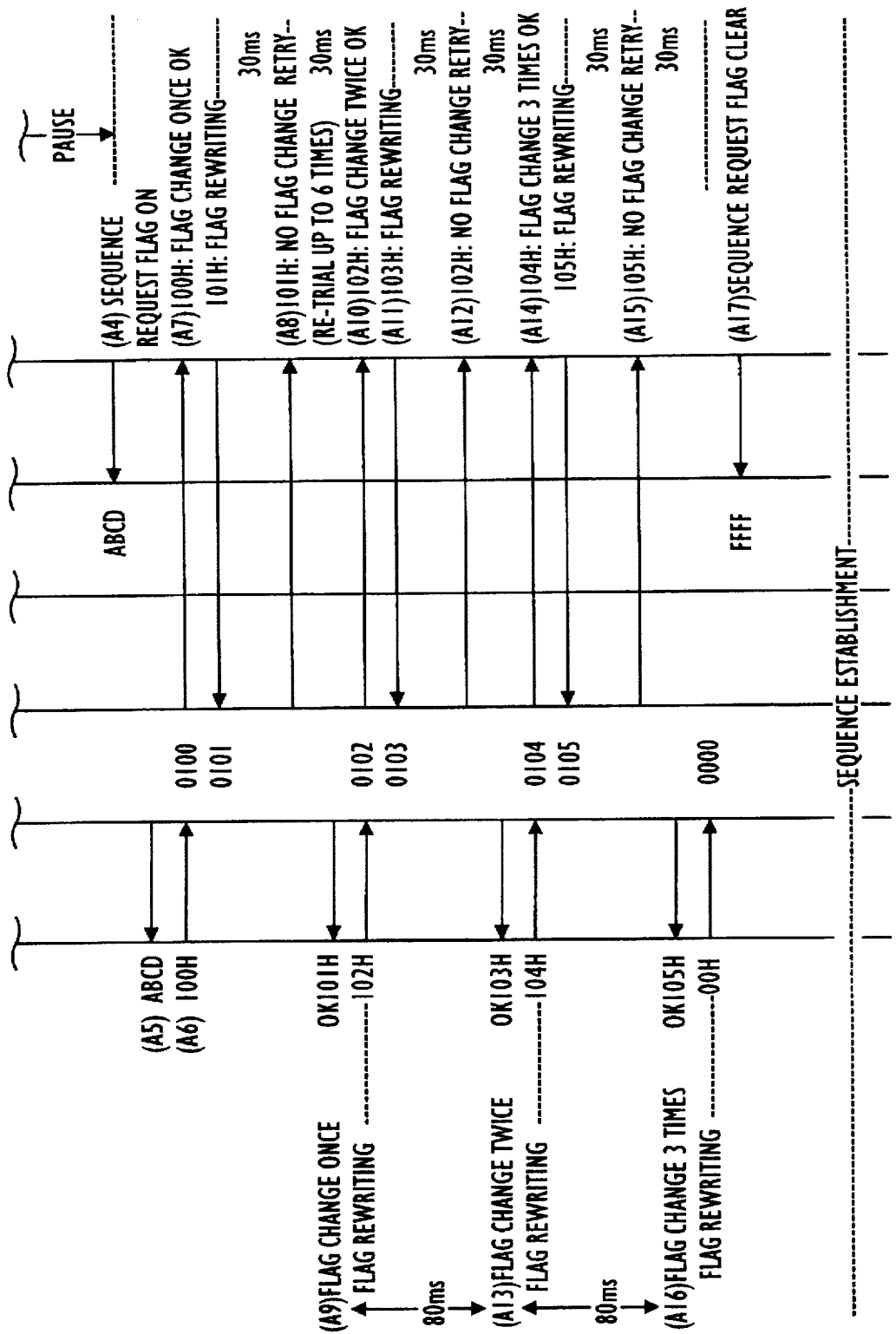

For example, when the DPRAM 2 is mounted with the CPU on the data transmission side, a sequence checking is performed in concrete according to the following steps (A1) through (A17), with reference to the signal sequence shown FIG. 5. The symbols (A1) through (A17) corresponds to those shown in FIG. 5.

(A1) The CPU (mounted with no DPRAM) on the receiving side detects that FAIL I/O information of the CPU (mounted with DPRAM) on the sending side has changed from abnormal state to normal state.

(A2) In order to start a sequence checking based on the detected result, the CPU on the receiving side writes a sequence check starting value (=0100H) in the PRV presence/absence flag portion 10 of the DPRAM 2. The flag portion 10 shows a presence or absence of data in data item being PROVISION data.

Thereafter, the CPU on the receiving side supervises the PRV presence/absence flag portion 10 at a period of 80 ms till the CPU on the sending side rewrites the flag portion 10 to a value (=0101H) showing starting a sequence checking process. The CPU also supervises till the sequence request flag portion 9 shows a value (=ABCDH) showing a sequence process request state to the CPU on sending side.

(A3) The CPU on the sending side initializes internally for 500 ms–600 ms from the restarting and clears all areas of the DPRAM 2 to zero.

(A4) In order to start a sequence processing after a completion of the initialization, the CPU on the sending side also writes a sequence request flag which declares a sequence processing with respect to the CPU on the receiving side.

(A5) Since the sequence request flag portion 9 is set to a desired value, the CPU on receiving side recognizes that the CPU on the sending side has started a sequence checking process.

(A6) The CPU on the receiving side writes again "0100H" to the PRV presence/absence flag portion 10.

(A7) The CPU on the sending side recognizes that the PRV presence/absence flag portion 10 has been changed correctly because the PRV presence/absence flag portion was cleared to zero in the step (A3) and was rewritten to "0100H" in the step (A6). Furthermore in order to continue the sequence checking, "0101H is written by incrementing the PRV presence/absence flag portion 10 by +1.

(A8) The CPU on the sending side supervises the PRV presence/absence flag portion 10 at a period of 30 ms while the CPU on the receiving CPU supervises and updates the PRV presence/absence flag portion 10 at a period of 80 ms.

Thus, when the CPU on the sending side is updated immediately after the PRV presence/absence flag in the CPU on the receiving side has been written, the PRV presence absence flag portion 10 may not have changed to a desired value during the first 30 ms after the writing operation. In this case, the CPU on the sending side verifies again whether the flag portion has changed to a desired value after 30 ms.

Such a trial is repeated six times. If the CPU on the sending side can verify the desired value in six trials, the checking result is judged to be normal and an increment operation is performed to add +1. If the flag portion does not change to a desired value after the six trials, it is judged that the CPU on the receiving side is in abnormal state. Hence communications are not performed to the CPU on the receiving side.

(A9) When it is verified that the PRV presence/absence flag portion 10 is incremented by +1 in the step (A7), the CPU on the receiving side recognizes that the PRV presence/absence flag portion 10 has been changed correctly.

Furthermore, in order to continue the sequence checking, the PRV presence/absence flag portion 10 is incremented by +1 to write "0102H".

(A10) through (A15) In the similar manner to the above steps, the sequence checking operation is repeated till both the CPUs on the receiving side and the CPU on the sending side can verify continuously and bidirectionally that the PRV presence/absence flag portion 10 has been updated three times.

(A16) If the continuous checking has been successful three times, the CPU on the receiving side clears the PRV presence/absence flag portion 10.

(A17) When it is verified that the PRV presence/absence flag portion 10 has been cleared through the step (A16), the CPU on the sending side writes "no sequence request (=FFFFH)" to the sequence request flag and completes the sequence checking operation. According to the process, after all the sequence checking is completed, the DPRAM 2 can perform stable reading/writing operation, whereby normal communications process can be performed.

Figure 6A:
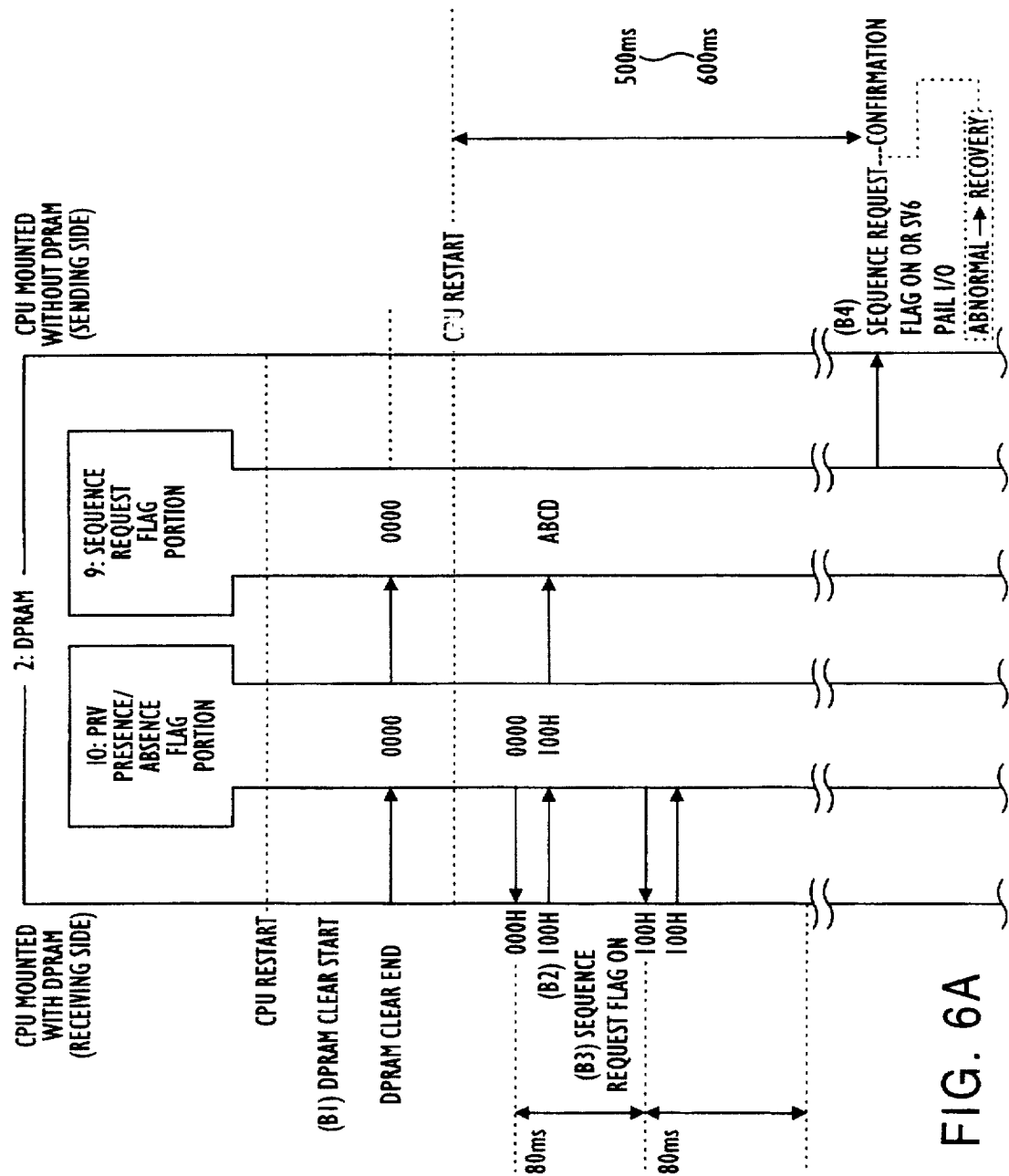
FIG. 6 is a sequence diagram showing an embodiment of the dual port RAM interface system according to the present invention.
Figure 6B:
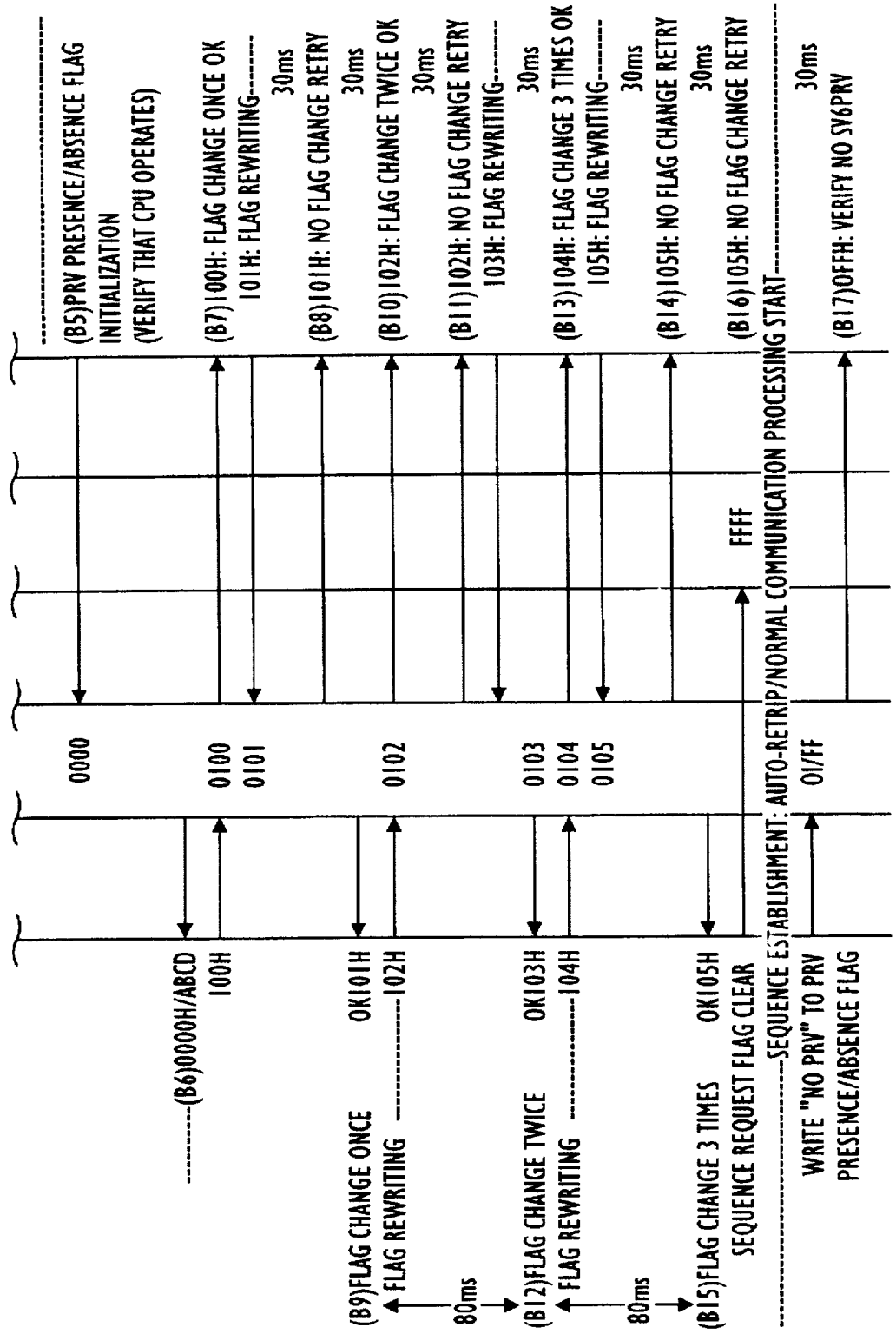
Figure 7:
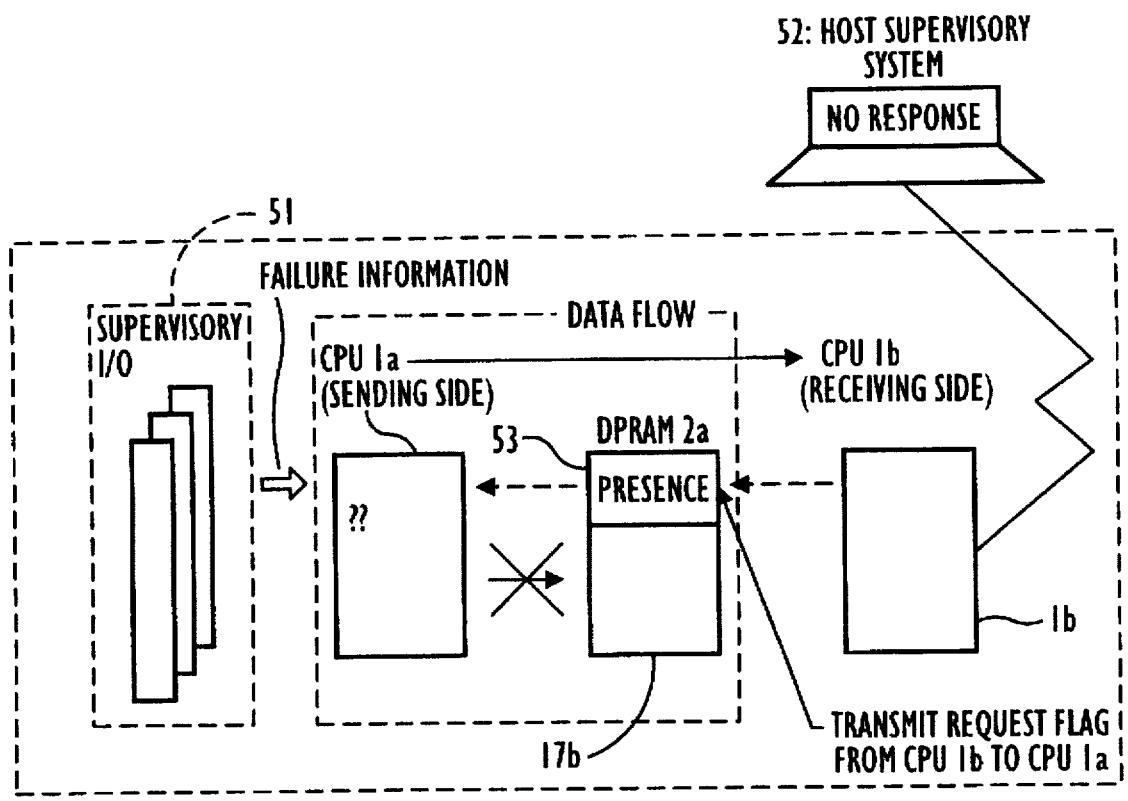
FIG. 7 is a block diagram showing a conventional dual port RAM interface system.

Referring to the steps (B1) through (B17) in the signal sequence shown in FIG. 6, when the DPRAM 2 is mounted together with the CPU on the data receiving side, the concrete sequence checking is performed according to the following steps applying the above basic operation. Symbols (B1) through (B17) correspond to those in FIG. 6.

(B1) First, after starting operation, the CPU on the receiving side clears the DPRAM 2 mounted with the self system to zero.

(B2) The CPU on the receiving side writes "0100H" to the DPRAM presence/absence flag portion 10 (data presence/absence flag) of the DPRAM 2.

(B3) In order to start the sequence checking, the CPU on the receiving side writes a value (=ABCDH) to the sequence request flag. The value shows which declares starting an sequence checking to the CPU on the sending side.

(B4) Then, the CPU on the sending side detects that the FAIL I/O of the CPU on the receiving side has changed from a fail occurrence to a fail recovery or that the sequence request flag shows "with sequence request".

(B5) In order to verify whether the CPU on the receiving side is operating normally, the CPU on the sending side writes the PRV presence/absence flag portion 10 to zero.

(B6) Since the CPU on the sending side has rewritten the PRV presence/absence flag portion 10 to zero in the step (B5), the CPU on the receiving side writes again "0100H" to the PRV presence/absence flag portion 10.

(B7) The CPU on the sending side has written zero to the PRV presence/absence flag portion 10 in the step (B5). However, since the CPU on the receiving side wrote "0100H" in the step (B6), it is recognized that the PRV presence/absence flag portion 10 has performed normal writing/reading operation, together with the CPU on the receiving side (first flag change in valid). Hence the CPU on the sending side writes "101H" by incrementing the value read in the PRV presence/absence flag portion 10 by +1.

(B8) through (B14) In the similar manner to the case that the DPRAM is mounted together with the CPU on the sending side, the sequence checking is retried till both the CPU on the receiving side and the CPU on the sending side can verify respectively and continuously the update of the PRV presence/absence flag portion 10 three times.

(B15) When the sequence checking has completed normally, the CPU on the receiving side rewrites a value (=FFFFH) indicating a completion of the checking to the sequence checking request flag.

(B16) Since the conventional processing steps follow from this step, the CPU on the sending side waits till the PRV presence/absence flag portion 10 is rewritten to an original value showing "with/without data".

(B17) The CPU on the sending side detects through the CPU on the receiving side that the PRV presence/absence flag portion 10 is rewritten in accordance with the presence or absence of data from the CPU on the receiving side, normal data communications is started.

When the DPRAM 2 is mounted together with both the CPU on the data sending side and the CPU on the receiving side, the following process is performed in case of a failed sequence checking.

In the steps (A8), (A12), and (A15) in FIG. 5, and the steps (B8), (B11), and (B14) in FIG. 6, it is supervised that the counter CPU has updated the PRV presence/absence flag portion 10. However, if a retrial operation cannot verify the updating by the counter CPU, it is recognized that the sequence checking has failed.

In this case, normally, the watch dog timer supervisory unit 4, which performs an WRITE access to the watch dog timer port 14, is ceased to operate. Therefore since the WRITE access is not performed within a period of time specified by the watch dog timer 3, the watch dog timer error is produced.

When each of the CPUs detects the watch dog timer error, the self CPU fail port 6, shown in FIG. 2, becomes on while the external CPU fail port 5 of the external CPU becomes on. Then it is informed externally that the entire system is in an abnormal state. In this state, both the CPUs are reset to an initial state and then are resumed for the sequence checking operation.

As described above, when the DPRAM 2 is used as a data communications medium, the CPUs each includes a watch dog timer supervisory unit 4, a external CPU fail port 5, a self CPU fail port 6, and a sequence checking unit 8 with a timer 7. The DPRAM 2 also has a sequence request flag portion 9 and a PRV presence/absence flag portion 10. The sequence checking unit 8 verifies whether both the CPUs are accessible to the DPRAM 2 to perform a normal writing/reading operation, by gaining an access to the DPRAM 2. If the verified results are normal, data communications can be performed later. If the DPRAM is unstable, both the CPUs can supervise till a stable reading/writing operation is performed to the DPRAM. Hence if a communication is started in a half-inserted state of the CPU unit, the sequence checking function can recognize the improper state. As a result, since a communication processing is not started, an erroneous operation can be prevented.

When an abnormal state is detected, a system damage information can be informed externally by producing an watch dog timer error. A host system or operator therefore can accurately grasp the condition of a system so that the entire system can be maintained easily.

Still other variations and modifications are possible within the scope of the present invention which is limited solely by the appended claims.

What is claimed is:

1. A dual port Random Access Memory (RAM) interfacing method which uses at least two CPUs being independent of each other: and a dual port RAM acting as data communications medium mounted with one of said at least two CPUs for performing data communications between said at least two CPUs, the method comprising the steps of:

accessing said dual port RAM by means of said one of said CPUs mounted with said dual port RAM, said one of said CPUs performing the steps of:

setting a sequence request flag to said dual port RAM after said dual port RAM is cleared to zero after a start-up; and rewriting test data after an external CPU of said at least two CPUs verifies that said test data, which was input by said external CPU, has been written in said dual port RAM;

accessing said dual port RAM of said one of said CPUs by said external CPU, said external CPU performing the steps of:

periodically referring to a fail port of said one of said CPUs to determine a state thereof;

rewriting test data to said dual port RAM when said one of said CPUs changes from an abnormal state to a normal state or a sequence request flag is set to said dual port RAM;

verifying that said test data has been rewritten to said dual port RAM by said one CPU;

verifying the test data rewriting operation using said one of said CPUs to again input test data when said test data is rewritten;

judging whether both said one of said CPUs and said external CPU are accessible to said dual port RAM to perform normal writing/reading; and starting data communications if obtained results of said judging exhibit a normal state, wherein said one of said CPUs mounted with dual port RAM performs the steps of:

rewriting said test data after said external CPU verifies the test data rewriting operation;

verifying again the test data rewriting operation using said external CPU to again input test data;

repeating the test data rewriting operation a predetermined number of times; and judging whether both said one CPU and said external CPU are accessible to said dual port RAM to perform normal writing/reading, wherein said external CPU of said at least two CPUs provided on a side where no dual port RAM is mounted, judges that both said external CPU and said one CPU on a side where said dual port RAM is mounted, are in a normal accessible state to said dual port RAM to implement a normal writing or reading operation when said external CPU sets test data to said dual port RAM and then verifies a rewriting operation of data set to said dual port RAM by said one CPU in a predetermined period of time, and wherein said external CPU judges that both said external CPU and said one CPU are not in a normal accessible state to said dual port RAM to implement a normal writing or reading operation when said external CPU sets test data and then does not verify an operation of rewriting data set in said dual port RAM by said one CPU in a predetermined period of time.

2. A dual port RAM interfacing method according to claim 1, wherein said external CPU performs the steps of:

rewriting test data after said one CPU verifies the test data rewriting operation;

verifying the test data rewriting operation by said one CPU;

repeating the test data rewriting operation a predetermined number of times; and judging whether both said one CPU and said external CPU are accessible to said dual port RAM to perform normal writing/reading.

3. A dual port RAM interfacing method according to claim 1, wherein said one CPU judges that both said one CPU and said external CPU of said at least two CPUs, are in a normal accessible state to said dual port RAM to implement a normal writing or reading operation when said one CPU sets a sequence request or test data to the dual port RAM and then verifies a rewriting operation of data set to said dual port RAM by said external CPU in a predetermined period of time, and wherein said one CPU judges that both said one CPU and said external CPU are not in a normal accessible state to said dual port RAM to implement a normal writing or reading operation when said one CPU sets a sequence request flag or test data and then does not verify an operation of rewriting data set in said dual port RAM by said external CPU in a predetermined period of time.

4. A dual port RAM interface system comprising at least two CPUs being independent of each other; and a dual port RAM mounted with one of said at least two CPUs and being a data communication medium to perform data communications between said at least two CPUs;

said CPUs each including:

a watch dog timer supervisory means for monitoring a time-out of a watch dog timer;

a self CPU fall port which becomes ON by recognizing that its associated CPU is in an abnormal state when said watch dog timer supervisory means detects that said watch dog timer has become a time-out;

an external CPU fail port which becomes ON upon occurrence of an abnormal state of an external CPU of said at least two CPUs; and a sequence checking means with a timer for monitoring a state of said external CPU through said external CPU fail port and for performing an operational confirmation of said dual port RAM;

said dual port RAM including:

a sequence request flag portion for performing a sequence request flag writing operation by said one CPU mounted with said dual port RAM; and a test data writing/reading portion for performing test data writing reading operation by both of said CPUs;

said sequence checking means in said one CPU on a side where said dual port RAM is mounted, including:

a sequence request control means for setting said sequence request flag in said sequence request flag portion of said dual port RAM; and a data presence/absence supervisory means for monitoring the test data writing/reading portion of said dual port RAM;

said sequence checking means in said external CPU on a side where said dual RAM is not mounted, including:

a sequence request supervisory means for monitoring that said sequence request flag is set in said sequence request flag portion of said dual port RAM;

a data presence/absence supervisory means for monitoring the test data writing/reading portion of said dual port RAM; and a data presence/absence flag control means for writing test data in said test data writing/reading portion when said sequence request flag is set in the sequence request flag portion of said dual port RAM;

wherein said sequence checking means in said one CPU and said sequence checking means in said external CPU judge that both of said CPUs are accessible to said dual port RAM to perform normal writing/reading, by gaining access to said external CPU fall port of each CPU, said sequence request flag portion of said dual port RAM, and said test data writing/reading portion, and wherein data communications start when results of said judging exhibit a normal state, wherein said sequence checking means includes means for determining that results of said judging are normal if said one of said CPUs and said external CPU are both accessible to said dual port RAM to perform normal writing/reading after a test data rewriting operation is repeated by both said external CPU and said one of said CPUs a predetermined number of times.

5. A dual port RAM interface system according to claim 4, wherein said test data rewriting operation includes inputting test data by said external CPU and said one of said CPUs, alternately.

* * * * *